(12) United States Patent
Yamamoto et al.

(10) Patent No.: US 6,195,285 B1
(45) Date of Patent: Feb. 27, 2001

(54) EEPROM DEVICE HAVING A CONSTANT DATA WRITING DURATION

(75) Inventors: Hiroki Yamamoto; Yoshihiro Tada, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/137,100

(22) Filed: Aug. 20, 1998

(30) Foreign Application Priority Data

Sep. 9, 1997 (JP) .................................................... 9-243743

(51) Int. Cl.[7] .................................................... G11C 16/04
(52) U.S. Cl. ................ 365/185.05; 365/185.03; 365/185.25; 365/185.24; 365/185.11
(58) Field of Search .................... 365/185.05, 185.03, 365/185.25, 185.24, 185.11

(56) References Cited

U.S. PATENT DOCUMENTS

| 5,615,149 | * | 3/1997 | Kobayashi et al. | 365/185.12 |
| 5,708,600 | * | 1/1998 | Hakozaki et al. | 365/185.03 |
| 5,748,530 | * | 5/1998 | Gotou et al. | 365/185.18 |
| 5,870,218 | * | 2/1999 | Jyouno et al. | 365/185.03 |
| 5,892,714 | * | 4/1999 | Choi | 365/185.22 |
| 5,912,842 | * | 6/1999 | Chang et al. | 365/185.11 |
| 5,970,012 | * | 10/1999 | Takeshima | 365/230.01 |

* cited by examiner

*Primary Examiner*—David Nelms
*Assistant Examiner*—Connie C. Yoha
(74) *Attorney, Agent, or Firm*—Arent Fox Kintner Plotkin & Kahn

(57) ABSTRACT

An EEPROM device has memory cells each including of a memory transistor and a selection transistor. The memory transistor has a floating gate between a control gate and a conducting channel formed between a drain and a source. The selection transistor has its source connected to the drain of the memory transistor. During writing of data, the control gate of the memory transistor is grounded, the source of the memory transistor is kept in an open state, and a voltage corresponding to the data to be written in is applied to the gate and the drain of the selection transistor.

4 Claims, 5 Drawing Sheets

EEPROM DEVICE HAVING A CONSTANT DATA WRITING DURATION

BACKGROUND OF THE INVENTION

1. Field of the Invention

The present invention relates to a type of semiconductor memory called an EEPROM (electrically erasable programmable read-only memory) device that allows rewriting of data to be performed individually in each memory cell.

2. Description of the Prior Art

An EEPROM device includes a number of memory cells each composed of, as shown in FIG. 7, a MOS-type FET (hereafter referred to as the "memory transistor") MT having a floating gate (a gate that is insulated from the surroundings) between a control gate CG and a conducting channel formed between a drain $D_M$ and a source $S_M$ within a silicon substrate, and a MOS-type FET (hereafter referred to as the "selection transistor") ST. To achieve storage of data, an EEPROM device exploits the fact that the threshold voltage of the memory transistor MT with respect to the control gate CG varies with the amount of electric charge accumulated in the floating gate FG. Note that part of the insulator (oxide film) between the floating gate FG and the drain $D_M$ is made thinner than its remaining part so that, by way of this thin part, electrons are injected into and expelled out of the floating gate FG by the tunnel effect.

The amount of electric charge accumulated in the floating gate FG of the memory transistor MT is usually so controlled that, as shown in FIG. 8, the threshold voltage of the memory transistor MT falls within one of two ranges that correspond to values "0" and "1" respectively. In this way, one bit of data is stored in each memory cell.

Note that, to read data from a memory cell of a one-bit-per-cell type as described above, it is necessary to prepare, as a voltage to be applied to the control gate CG of the memory transistor MT, a reference voltage E (see FIG. 8) that is approximately intermediate between the above-mentioned two ranges of the threshold voltage.

In recent years, to cope with demand for larger storage capacity, much research has been done in the field of so-called multivalued storage that aims to store two or more bits of data in one memory cell. For example, by controlling the amount of electric charge accumulated in the floating gate FG of the memory transistor MT in such a way that, as shown in FIG. 9, the threshold voltage of the memory transistor MT falls within one of four ranges that correspond to values "00", "01", "10", and "11" respectively, it is possible to store two bits of data in one memory cell.

Note that, to read data from a memory cell of a two-bits-per-cell type as described above, it is necessary to prepare, as voltages to be applied to the control gate CG of the memory transistor MT, a first reference voltage E1, a second reference voltage E2, and a third reference voltage E3 (see FIG. 9) that are approximately intermediate between the above-mentioned four ranges of the threshold voltage.

In an EEPROM device, writing of data to a memory cell is performed in the following manner. First, a high-level voltage (for example, 15 V) is applied to the gate G and the drain $D_S$ of the selection transistor ST, with the control gate CG of the memory transistor MT grounded and with the source $S_M$ of the memory transistor MT kept open (i.e. non-connected). This causes electrons to be expelled out of the floating gate FG of the memory transistor MT.

To control the amount of electric charge accumulated in the floating gate FG in accordance with the data to be written in, whereas the high-level voltage applied to the gate G and the drain $D_S$ of the selection transistor ST is kept constant regardless of the data to be written in, the duration of data writing is varied in accordance with the data to be written in. Specifically, the longer the data writing duration, the greater the number of electrons expelled out of the floating gate FG and therefore the more the threshold voltage of the memory transistor MT drops. In contrast, the shorter the data writing duration, the smaller the number of electrons expelled out of the floating gate FG and therefore the less the threshold voltage drops.

Note that, before writing of data, erasing is performed. This causes a predetermined amount of electric charge to be accumulated in the floating gate FG and thereby makes rewriting of data possible.

As described above, in a conventional EEPROM device, the duration of data writing is controlled in accordance with the data to be written in. However, a process that depends on control of duration tends to cause unduly large variations in the distribution of the threshold voltage of the memory transistor MT, leading in some cases to garbled data. Moreover, controlling the duration of data writing naturally results in longer writing times with particular types of data than with other types of data, and thus, on the whole, requires longer writing times.

These inconveniences of a conventional EEPROM device are becoming increasingly intolerable as multivalued storage technology advances, that is, as more and more bits of data are stored in one memory cell.

SUMMARY OF THE INVENTION

An object of the present invention is to provide an EEPROM device that can perform writing of data with higher accuracy and with reduced time on the whole.

To achieve the above object, according to the present invention, an EEPROM device that has a memory transistor having a floating gate between a control gate and a conducting channel formed between a drain and a source and that achieves storage of data by exploiting the fact that the threshold voltage of the memory transistor varies with the amount of electric charge accumulated in the floating gate is so designed that, during writing of data, the voltage between the drain and the control gate of the memory transistor is varied in accordance with the data to be written in.

Here, after the completion of erasing, if the duration of data writing is kept constant, then the amount of electric charge accumulated in the floating gate FG of the memory transistor MT depends on the voltage between the drain $D_M$ and the source $S_M$ of the memory transistor MT and on the voltage between the drain $D_M$ and the control gate CG of the same transistor.

Based on this principle, in this structure, even if the data writing duration is kept constant, it is still possible to control the amount of electric charge accumulated in the floating gate FG of the memory transistor MT in accordance with the data to be stored. That is, it is possible, during writing of data, to keep the data writing duration constant regardless of the data that is going to be written in.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
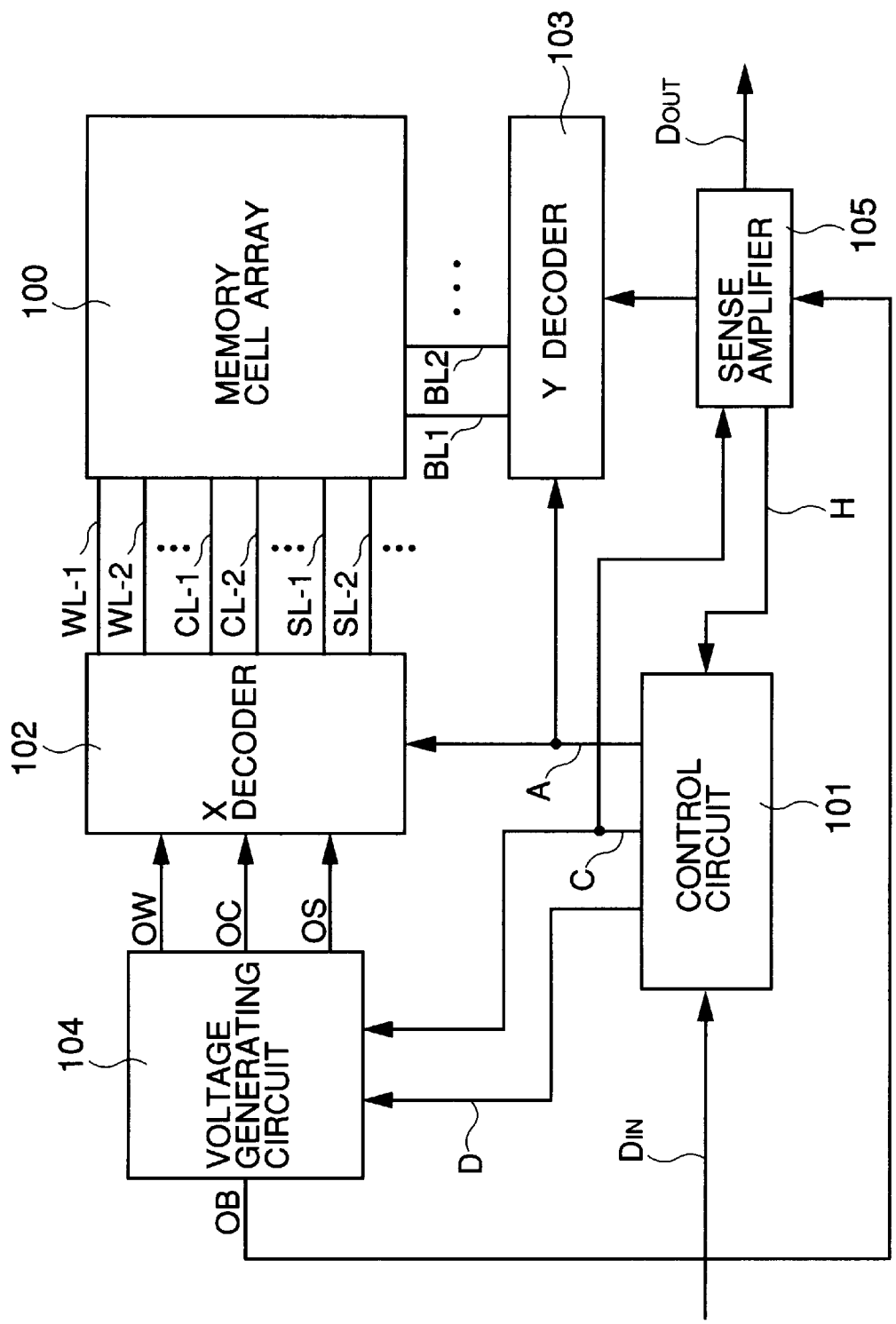
FIG. 1 is a block diagram of an EEPROM device embodying the present invention.

Hereinafter, an embodiment of the present invention will be described with reference to the drawings. FIG. 1 shows a block diagram of an EEPROM device embodying the present invention. This EEPROM device stores data on a two-bits-per-cell basis, and handles input and output of data serially.

This EEPROM device is composed of blocks that operate as described below. A control circuit 101 receives, from the outside, input data $D_{IN}$ that includes an instruction code and an address code, and extracts from the input data $D_{IN}$ the instruction code C, the address code A, and a data code D. The control circuit 101 feeds the address code A to an X decoder 102 and a Y decoder 103, feeds the instruction code C and the data code D to a voltage generating circuit 104, and feeds the instruction code C to a sense amplifier 105.

In accordance with the address code A fed from the control circuit 101, the X decoder 102 selects one of the word lines WL1, WL2, . . . of the memory cell array 100, one of the control lines CL1, CL2, . . . thereof, and one of the source lines SL1, SL2, . . . thereof. Of these lines selected by the X decoder 102, the word line is connected to an output terminal OW of the voltage generating circuit 104, the control line is connected to another output terminal OC of the voltage generating circuit 104, and the source line is connected to another output terminal OS of the voltage generating circuit 104.

In accordance with the address code A fed from the control circuit 101, the Y decoder 103 selects one of the bit lines BL1, BL2, . . . of the memory cell array 100.

In accordance with the instruction code C and the data code D fed from the control circuit 101, the voltage generating circuit 104 changes the voltages it outputs at its output terminals OW, OC, OS, and OB. Specifically, during data writing (i.e. when the instruction code C is an instruction requesting writing of data), the voltage generating circuit 104, on completion of erasing, makes the voltages outputted at the output terminals OW and OB equal to a high-level voltage $V_{PP}$ that is obtained by stepping up the power source voltage, makes the voltage outputted at the output terminal OC equal to a ground level, and brings the output terminal OS into an open state (i.e. a high-impedance state). At this time, the high-level voltage $V_{PP}$ that is outputted at the output terminals OW and OB is varied in accordance with the data that is about to be written (i.e. the data code D). Note that, during erasing, the voltages outputted at the output terminals OW and OC are made equal to the highest voltage available as the high-level voltage $V_{PP}$, and the voltages outputted at the output terminals OS and OB are made equal to the ground level.

On the other hand, during data reading (i.e. when the instruction code C is an instruction requesting reading of data), the voltage generating circuit 104 makes the voltages outputted at the output terminals OW and OB equal to the power source voltage, makes the voltage outputted at the output terminal OS equal to the ground level, and makes the voltage outputted at the output terminal OC first equal to a second reference voltage E2 and thereafter, in accordance with the instruction code C fed from the control circuit 101, equal to either a first reference voltage E1 or a third reference voltage E3.

The sense amplifier 105 applies the voltage outputted at the output terminal OB of the voltage generating circuit 104 to the bit line of the memory cell array 100 that was selected by the Y decoder 104. In addition, during data reading, the sense amplifier 104 checks whether a current flows into this bit line of the memory cell array 100 or not, that is, reads the data stored in the memory cell selected by the X decoder 103 and the Y decoder 104, and outputs the detected data $D_{OUT}$.

More specifically, during data reading, while the voltage at the output terminal OC of the voltage generating circuit 104 is kept equal to the second reference voltage E2, the sense amplifier 105 feeds the control circuit 101 with a judgment signal H that indicates whether a current actually flowed into the bit line or not. In response, the control circuit 101 feeds an instruction code C to the voltage generating circuit 104 to instruct it whether the voltage outputted at the output terminal OC is to be switched from the second voltage E2 to the first reference voltage E1 or to the third reference voltage E3.

Figure 2:
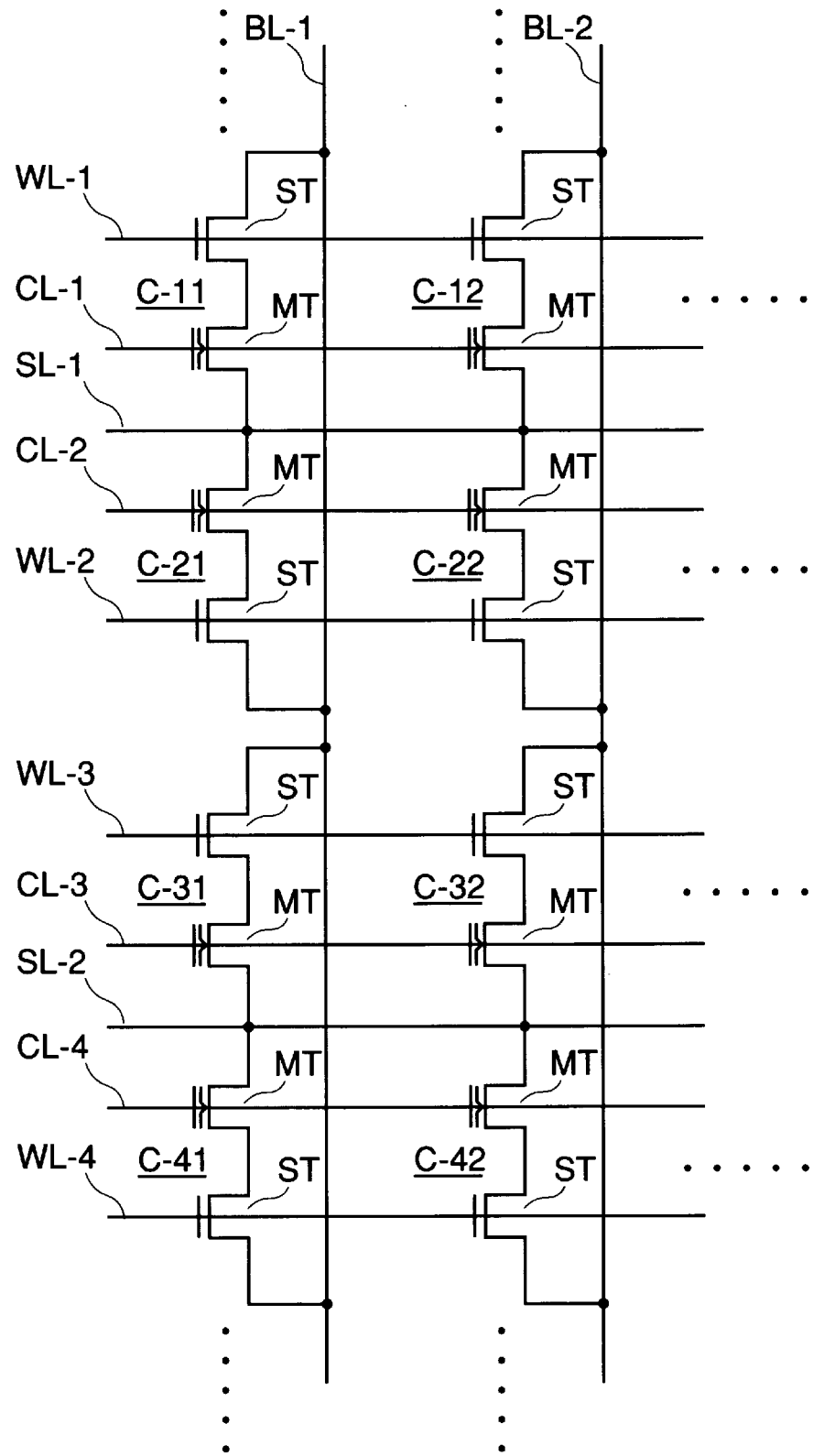
FIG. 2 is a diagram illustrating the structure of the memory cell array.
Figure 7:
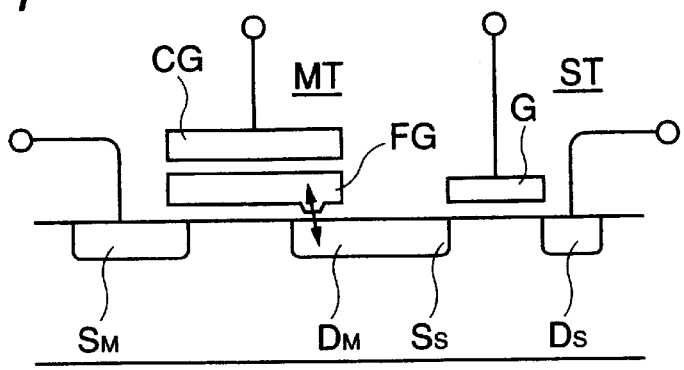
FIG. 7 is a diagram illustrating the structure of each memory cell of an EEPROM device.
Figure 8:
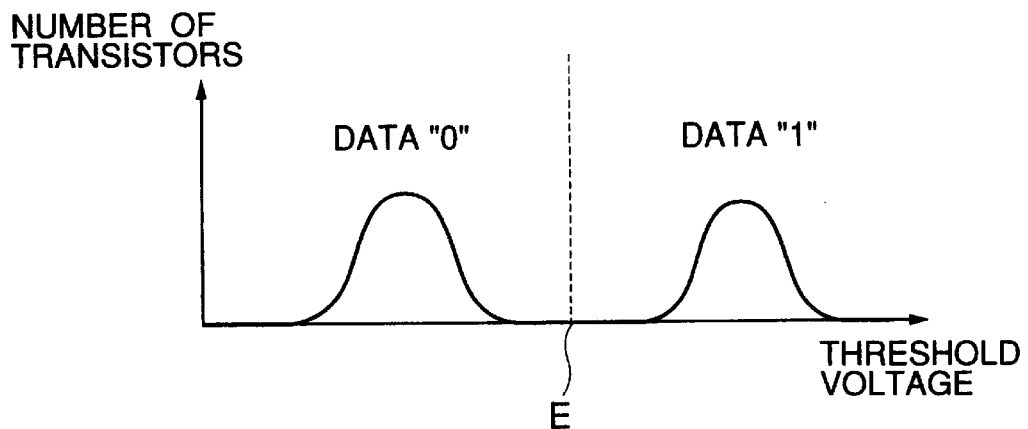
FIG. 8 is a diagram illustrating the distribution of the threshold voltage of the memory transistor MT in cases where one bit of data is stored in each memory cell.
Figure 9:
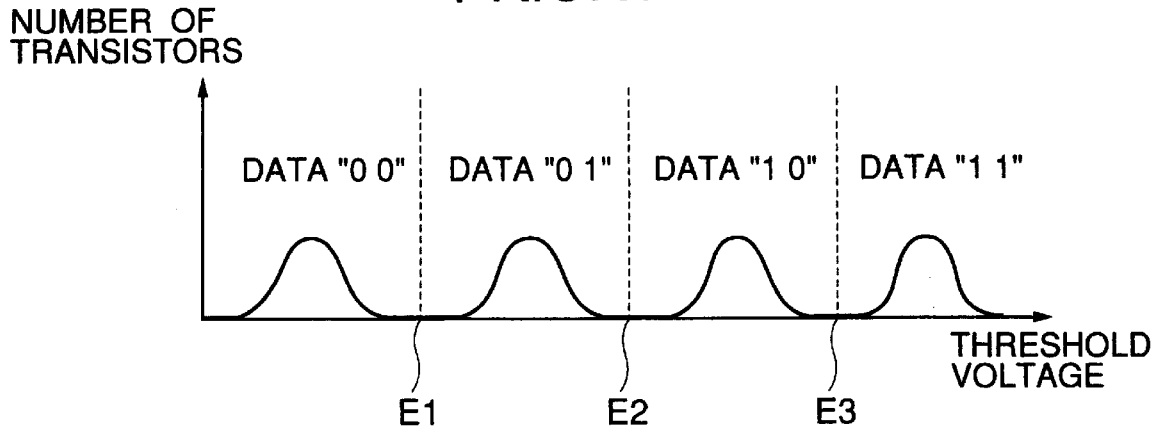
FIG. 9 is a diagram illustrating the distribution of the threshold voltage of the memory transistor MT in cases where two bits of data are stored in each memory cell.

FIG. 2 shows the structure of the memory cell array 100. In FIG. 2, C-11, C-12, . . . , C-21, C-22, . . . , C-31, C-32, . . . , C-41, C-42, . . . represent memory cells each composed of, as shown in FIG. 7, a memory transistor MT and a selection transistor ST; WL-1 and WL-2 represent word lines; CL-1 and CL-2 represent control lines; BL-1 and BL-2 represent bit lines; and SL-1 and SL-2 represent source lines.

These elements are interconnected in the following manner. The word line WL-1 is connected to the gates of the selection transistors ST of the memory cells C-11 and C-12; the word line WL-2 is connected to the gates of the selection transistors ST of the memory cells C-21 and C-22.

The control line CL-1 is connected to the control gates of the memory transistors MT of the memory cells C-11 and C-12; the control line CL-2 is connected to the control gates of the memory transistors MT of the memory cells C-21 and C-22.

The bit line BL-1 is connected to the drains of the selection transistors ST of the memory cells C-11 and C-21; the bit line BL-2 is connected to the drains of the selection transistors ST of the memory cells C12 and C-22.

The source line SL-1 is connected to the sources of the memory transistors MT of the memory cells C-11, C-12, C-21, and C-22. The source line SL-2 is connected to the sources of the memory transistors MT of the memory cells C-31, C-32, C-41, and C-42.

In the memory cell array 100 having the structure as described above, during writing of data, the above-mentioned blocks operate in such a way that appropriate voltages are applied to the individual lines in the following manner. Suppose that data is about to be written to the memory cell C-11.

First, a high-level voltage $V_{PP}$ is applied to the word line WL-1 and the control line CL-1 (note that, although the high-level voltage $V_{PP}$ may in reality be selected from among a plurality of voltages, it is here assumed that it is set at the highest available voltage $V_{PP}$ (MAX)). Simultaneously, the bit line BL-1 and the source line SL-1 are grounded.

Figure 3:
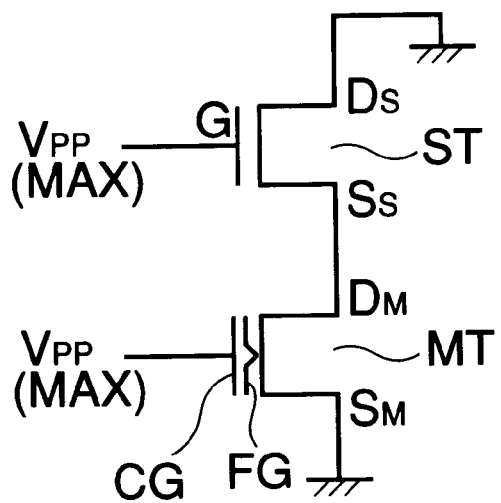
FIG. 3 is a diagram illustrating the state of a memory cell during erasing that is performed prior to writing of data.

As a result, in the memory cell C-11, as shown in FIG. 3, the control gate CG of the memory transistor MT and the gate G of the selection transistor ST receive the high-level voltage $V_{PP}$ (MAX), and the drain $D_S$ of the selection transistor ST and the source $S_M$ of the memory transistor MT are grounded. This causes electrons to be injected into the floating gate FG of the memory transistor MT so that a predetermined amount of electric charge is accumulated in the floating gate FG, and thereby the data that has thus far been stored in the memory cell C-11 is erased.

Figure 5:
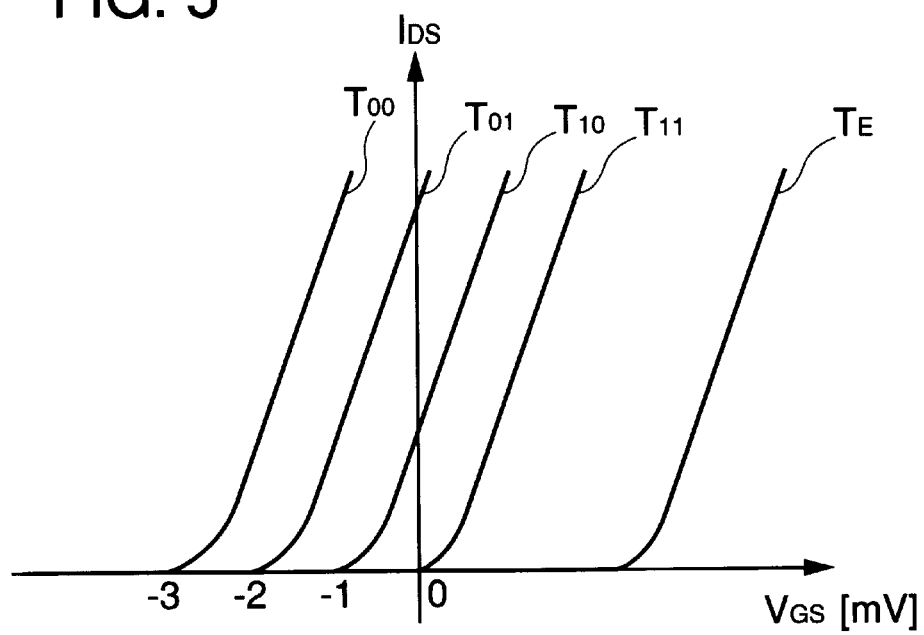
FIG. 5 is a diagram illustrating the relation between the control gate CG-source $S_M$ voltage $V_{GS}$ and the drain $D_M$-source $S_M$ current $I_{DS}$ of the memory transistor MT.

In this way, prior to writing of data, the data stored in the memory cell to which new data is about to be written in is erased so as to make rewriting of data possible. Note that, in a memory cell whose data has just been erased, the relation between the control gate CG-source $S_M$ voltage $V_{GS}$ and the drain $D_M$-source $S_M$ current $I_{DS}$ of the memory transistor MT describes a characteristic line $T_E$ as shown in FIG. 5 such that the threshold voltage of the memory transistor MT is at its maximum.

On completion of such erasing, writing of data is started. Writing of data is performed in the following manner. The control line CL-1 is grounded, the source line SL-1 is brought into an open state, and a high-level voltage $V_{PP}$ corresponding to the data to be written in is applied to the word line WL-1 and the bit line BL-1. This state is kept for a predetermined length of time T.

Figure 4:
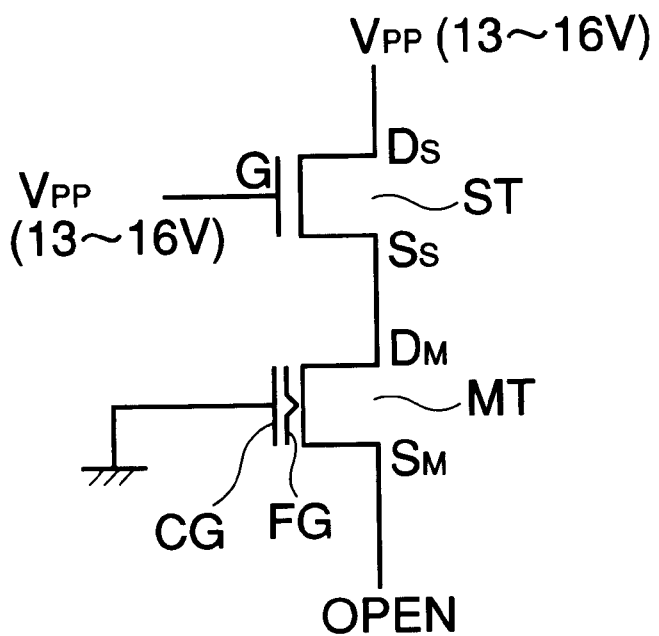
FIG. 4 is a diagram illustrating the state of a memory cell during writing of data.

As a result, for this predetermined length of time T, in the memory cell C-11, as shown in FIG. 4, the control gate CG of the memory transistor MT is kept grounded, the source $S_M$ of the memory transistor MT is kept open, and the gate G and the drain $D_S$, of the selection transistor ST keep receiving the high-level voltage $V_{PP}$ corresponding to the data to be written in. This causes electrons to be expelled out of the floating gate FG.

During this writing of data, the higher the high-level voltage $V_{PP}$, the greater the number of electrons expelled out of the floating gate FG and therefore the more the threshold voltage of the memory transistor MT drops. In contrast, the lower the high-level voltage $V_{PP}$, the smaller the number of electrons expelled out of the floating gate FG and therefore the less the threshold voltage of the memory transistor MT drops. Thus, since the high-level voltage $V_{PP}$ is set at a voltage that corresponds to the data to be written in, the threshold voltage of the memory transistor MT is determined in accordance with the data to be written in.

In the embodiment under discussion, during writing of data, the high-level voltage $V_{PP}$ is set at 13 V, 14 V, 15 V, or 16 V when writing a two-bit data "11", "10", "01", or "00", respectively.

Figure 6:
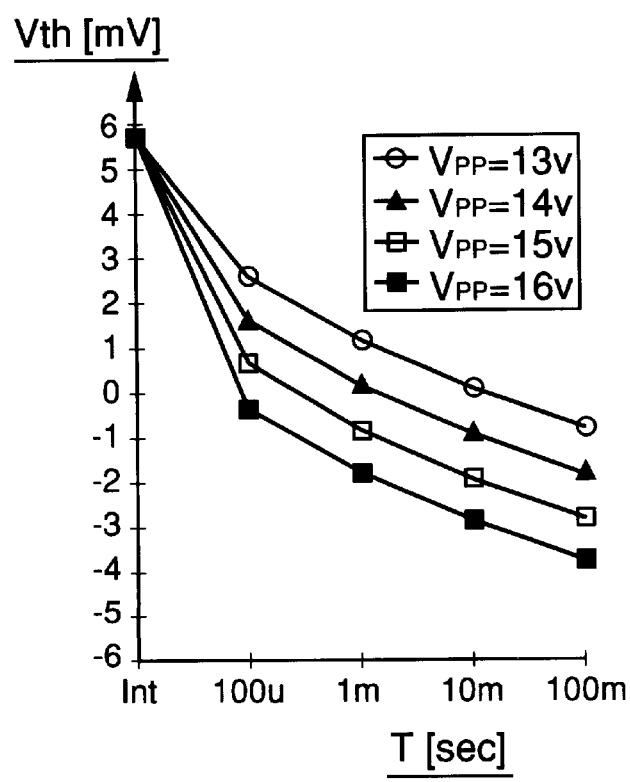
FIG. 6 is a diagram illustrating the relation between the data writing duration T and the threshold voltage $V_{th}$ of the memory transistor MT at different high-level voltages $V_{PP}$.

Moreover, in this embodiment, during writing of data, the data writing duration T (the above-mentioned predetermined length of time) and the threshold voltage $V_{th}$ of the memory transistor MT exhibit, at different high-level voltages $V_{PP}$, relations as shown in FIG. 6. In a case where milliseconds, the threshold voltage of the memory transistor MT is 0 mV, −1 mV, 2 mV, or −3 mV when $V_{PP}$ is 13 V, 14 V, 15 V, or 16 V, respectively. Accordingly, after the writing of a two-bit data "11", "10", "01", or "00", the relation between the control gate CG-source $S_M$ voltage $V_{GS}$ and the drain $D_M$-source $S_M$ current $I_{DS}$ of the memory transistor MT describes a characteristic line $T_{11}$, $T_{10}$, $T_{01}$, or $T_{00}$ as shown in FIG. 5, respectively.

In this way, the threshold voltage of the memory transistor MT is set at different voltages for different values of two-bit data, and this makes it possible to store two bits of data in one memory cell. Writing of data as described above (including erasing that is performed prior to writing) is performed not only with the memory cell C-11 but also with the other memory cells C-12, C-21, C-22, and so forth, so that two-bit data is written to and stored in each memory cell.

In short, in the EEPROM device of this embodiment, during writing of data, the voltage applied to the gate G and the drain $D_S$ of the selection transistor ST is varied in accordance with the data to be written in, and thereby the voltage applied between the drain $D_M$ and the control gate CG of the memory transistor MT is varied in accordance with the data to be written in. This makes it possible to keep the data writing duration constant regardless of the data to be written in. By keeping the data writing duration constant regardless of the data to be written in, it is possible to reduce variations in the distribution of the threshold voltage of the memory transistor MT and thereby increase data writing accuracy. In addition, by keeping the data writing duration constant regardless of the data to be written in, it is possible to reduce data writing times on the whole.

Although the above description of the EEPROM device of the embodiment deals only with a case in which two bits of data are stored in one memory cell, it is also possible to store more bits of data in one memory cell. In that case, assuming that n bits of data are stored in one memory cell, by making available $2^n$ different voltages as the high-level voltage $V_{PP}$, it is possible to perform writing of data with constant data writing duration regardless of the data to be written in.

As described above, in an EEPROM device according to the present invention, it is possible to keep the data writing duration constant regardless of the data to be written in. As a result, it is possible to reduce variations in the distribution of the threshold voltage of the memory transistor and thereby increase data writing accuracy, and in addition it is possible to reduce data writing times on the whole. The greater the number of bits stored in one memory cell, the more striking these advantages of the present invention.

What is claimed is:

1. An EEPROM device comprising:
    a memory transistor having a floating gate between a control gate and a conducting channel formed between a drain and a source;
    recording means for varying a voltage between the drain and the control gate of said memory transistor in accordance with data to be written in during writing of data; and
    a selection transistor having a source connected to the drain of said memory transistor,
    wherein said recording means keeps constant a voltage applied to the control gate of said memory transistor, keeps the source of said memory transistor in an open state, and applies to a gate and a drain of said selection transistor a voltage corresponding to the data to be written in.

2. An EEPROM device as claimed in claim 1, further comprising:

control means for causing a predetermined amount of electric charge to be accumulated in the floating gate of said memory transistor prior to writing of data.

3. An EEPROM device as claimed in claim 1, wherein the drain of said memory transistor and the source of said selection transistor are formed by a single region formed on a semiconductor substrate.

4. An EEPROM device comprising:

a memory transistor having a floating gate between a control gate and a conducting channel formed between a drain and a source;

recording means for varying a voltage between the drain and the control gate of said memory transistor in accordance with data to be written in during writing of data;

control means for causing a predetermined amount of electric charge to be accumulated in the floating gate of said memory transistor prior to writing of data; and a selection transistor having a source connected to the drain of said memory transistor, wherein said recording means keeps constant a voltage applied to the control gate of said memory transistor, keeps the source of said memory transistor in an open state, and applies to a gate and a drain of said selection transistor a voltage corresponding to the data to be written in.

* * * * *